United States Patent
Weng et al.

(10) Patent No.: US 10,866,515 B2
(45) Date of Patent: Dec. 15, 2020

(54) LITHOGRAPHY PROCESS USING PHOTORESIST MATERIAL WITH PHOTOSENSITIVE FUNCTIONAL GROUP

(71) Applicant: Taiwan Semiconductor Manufacturing Co., Ltd., Hsinchu (TW)

(72) Inventors: Ming-Hui Weng, New Taipei (TW); Cheng-Han Wu, Taichung (TW); Ching-Yu Chang, Yilang County (TW); Chin-Hsiang Lin, Hsinchu (TW); Siao-Shan Wang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 162 days.

(21) Appl. No.: 16/124,063

(22) Filed: Sep. 6, 2018

(65) Prior Publication Data

US 2019/0157073 A1  May 23, 2019

Related U.S. Application Data

(60) Provisional application No. 62/587,862, filed on Nov. 17, 2017.

(51) Int. Cl.
  *G03F 7/039* (2006.01)
  *H01L 21/027* (2006.01)
  *G03F 7/20* (2006.01)
  *H01L 21/308* (2006.01)
  *G03F 7/004* (2006.01)

(52) U.S. Cl.
  CPC .......... *G03F 7/0392* (2013.01); *G03F 7/0045* (2013.01); *G03F 7/0397* (2013.01); *G03F 7/70033* (2013.01); *H01L 21/0274* (2013.01); *H01L 21/3081* (2013.01); *H01L 21/3083* (2013.01)

(58) Field of Classification Search
  CPC .................................................... G03F 7/0392
  See application file for complete search history.

(56) References Cited

U.S. PATENT DOCUMENTS

| | | | |
|---|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |

(Continued)

*Primary Examiner* — Kathleen Duda
(74) *Attorney, Agent, or Firm* — Birch, Stewart, Kolasch & Birch, LLP

(57) ABSTRACT

Methods for forming a semiconductor structure including using a photoresist material are provided. The method for forming a semiconductor structure includes forming a material layer over a substrate and forming a photoresist layer over the material layer. The method for forming a semiconductor structure further includes performing an exposure process on the photoresist layer and developing the photoresist layer. In addition, the photoresist layer is made of a photoresist material comprising a photosensitive polymer, and the photosensitive polymer has a first photosensitive functional group bonding to a main chain of the photosensitive polymer and a first acid labile group bonding to the first photosensitive functional group.

20 Claims, 7 Drawing Sheets

(56) References Cited

U.S. PATENT DOCUMENTS

| | | |
|---|---|---|
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2003/0165751 A1* | 9/2003 | Elian .................. G03F 1/78 430/5 |
| 2015/0200130 A1 | 7/2015 | Huang et al. |
| 2017/0227851 A1 | 8/2017 | Lai et al. |

* cited by examiner

LITHOGRAPHY PROCESS USING PHOTORESIST MATERIAL WITH PHOTOSENSITIVE FUNCTIONAL GROUP

PRIORITY CLAIM AND CROSS-REFERENCE

This Application claims the benefit of U.S. Provisional Application No. 62/587,862, filed on Nov. 17, 2017, and entitled "Lithography material and lithography process", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

One of the important drivers for increased performance in a semiconductor structure is the higher level of integration of circuits. This is accomplished by miniaturizing or shrinking device sizes on a given chip. However, as the device sizes shrink, lithography processes used to form the devices also become more and more challenging.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
FIGS. 1A to 1E show cross-sectional representations of various stages of forming a semiconductor structure including performing an extreme ultraviolet (EUV) lithography process in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The advanced lithography process, method, and materials described below can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of photoresist materials used in lithography processes and methods for forming semiconductor structures using the photoresist materials are provided. The photoresist material may be used to form a photoresist layer and a pattern may be formed in the photoresist layer by performing an exposure process and a developing process. In addition, the photoresist material may include compounds with additional photosensing structures which are configured to improve the quantum efficiency during the lithography process.

FIGS. 1A to 1E show cross-sectional representations of various stages of forming a semiconductor structure 100 including performing an extreme ultraviolet (EUV) lithography process in accordance with some embodiments. As shown in FIG. 1A, a material layer 104 is formed over a substrate 102 in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and diamond. Examples of the compound semiconductor materials may include, but are not limited to, silicon carbide, gallium arsenic, gallium phosphide, indium phosphide, indium arsenide, and indium antimonide. Examples of the alloy semiconductor materials may include, but are not limited to, SiGe, GaAsP, AlInAs, AlGaAs, GaInAs, GaInP, and GaInAsP.

In addition, the substrate 102 may include structures such as doped regions including wells and source/drain regions, isolation features including shallow trench isolation (STI), inter-level dielectric (ILD) layers, and/or conductive features including gate electrodes, metal lines, vias, and contacts.

The material layer 104 is formed over the substrate 102 and is configured to be patterned in subsequent manufacturing processes in accordance with some embodiments. The material layer 104 may include one or more material layers. In some embodiments, the material layer 104 includes a silicon layer, a dielectric layer, and/or a doped poly-silicon layer.

After the material layer 104 is formed, a photoresist layer 106 is formed over the material layer 104, as shown in FIG. 1A in accordance with some embodiments. In some embodiments, the photoresist layer 106 is formed by coating a photoresist material over the material layer 104. The photoresist material may include compounds having additional photosensing structures to have improved photosensitivity. The photoresist material may include photosensitive polymers, and the photosensitive polymers may have photosensitive functional groups and acid labile groups. In addition, the photoresist material may further include photoacid generators (PAGs). Details of the photoresist material for forming the photoresist layer 106 will be described in more details afterwards.

Figure 1B:
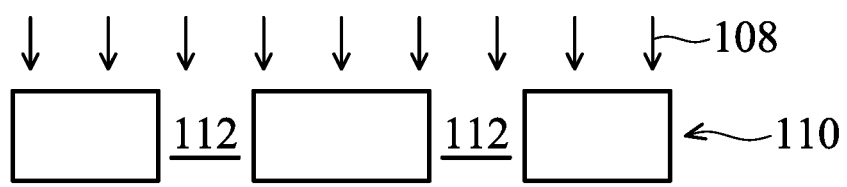
Figure 1B:
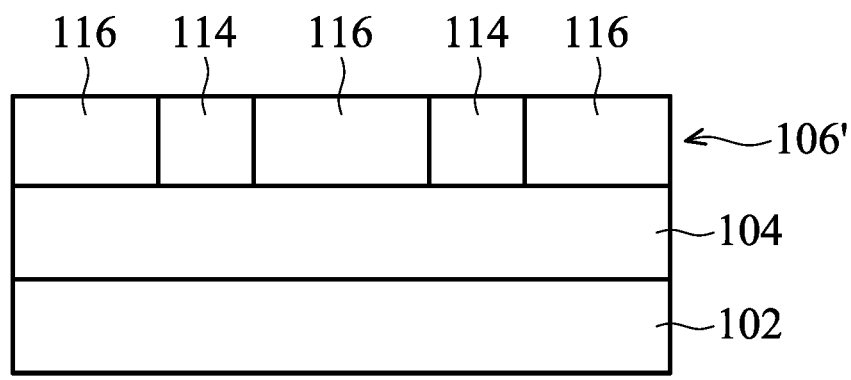

After the photoresist layer 106 is formed, an exposure process 108 is performed on the photoresist layer 106 to form a patterned photoresist layer 106', as shown in FIG. 1B in accordance with some embodiments. In some embodiments, a mask structure 110 with openings 112 is positioned over the photoresist layer 106 during the exposure process 108, so that the patterned photoresist layer 106' has exposed portions 114 and unexposed portions 116.

The exposure process 108 may include exposing the exposed portions 114 to a radiation. In some embodiment, the radiation has a wavelength smaller than 250 nm. In some embodiments, the radiation includes KrF, ArF, EUV, or E-beam. More specifically, the photosensitive functional groups in the exposed portions 114 will release electrons when they are exposed to radiation (e.g. light), and the resulting electrons will then react with PAGs so that proton sources are generated to form an acidic environment. In the acidic environment, the acid labile groups of the photosensitive polymer will be released from the photosensitive polymer to form a carboxyl group on the photosensitive polymer, and the solubility of the photoresist material at exposed portions 114 will therefore be altered. In addition, the photoresist material used to form the photoresist layer 106 includes additional photo-sensing structures as described previously, and these additional photo-sensing structures may help to improve the energy conversion efficiency during the lithography process.

After the exposure process 108 is performed, the mask structure 110 is removed. Afterwards, the patterned photoresist layer 106' is heated in a post exposure baking process after the exposure process 108 is performed in accordance with some embodiments. The post exposure baking process may help the reaction in the exposed portions 114 so that more acid labile groups will be released from the photosensitive polymers and therefore the exposed portions 114 will become more hydrophilic. In addition, the heating of the patterned photoresist layer 106' may also help to dry the patterned photoresist layer 106'.

Figure 1C:
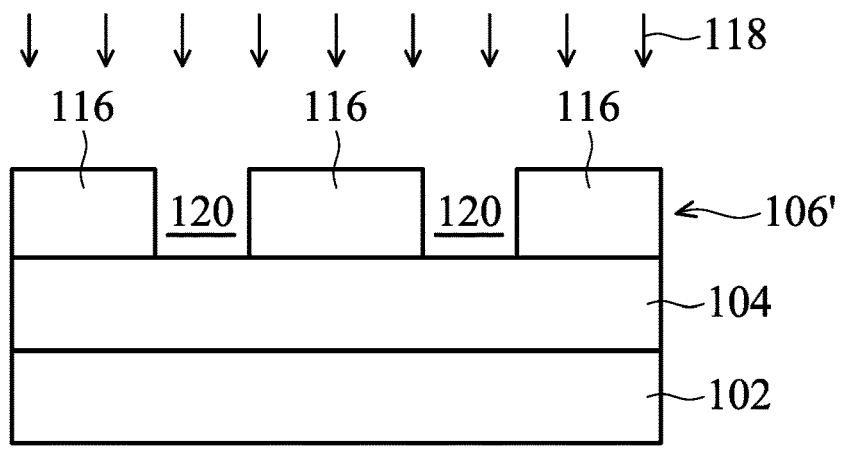

Next, a developing process 118 is performed on the patterned photoresist layer 106' to form openings 120, as shown in FIG. 1C in accordance with some embodiments. The exposed portions 114 of the patterned photoresist layer 106' are dissolved in a developer used in the developing process 118 and are removed with the developer.

In some embodiments, the developer is a positive tone developer used in a EUV process. In some embodiments, the developer is a basic solution. In some embodiments, the developer includes tetramethylammonium hydroxide (TMAH). In some embodiments, the developer is 2.38% TMAH.

Figure 1D:
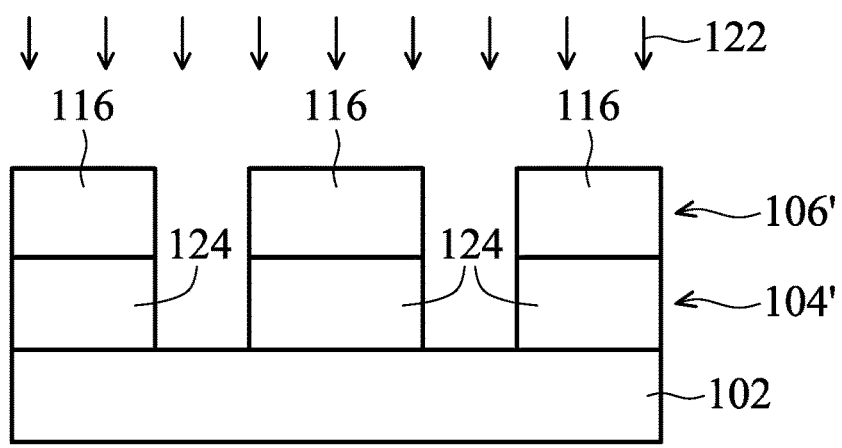

As shown in FIG. 1C, after the developing process 118 is performed, exposed portions 114 are removed by the developer to form the openings 120 while the unexposed portions 116 are left over the material layer 104 in accordance with some embodiments. Afterwards, an etching process 122 is performed to etch the material layer 104 through the openings 120 to form patterned material layer 104', as shown in FIG. 1D in accordance with some embodiments.

Figure 1E:
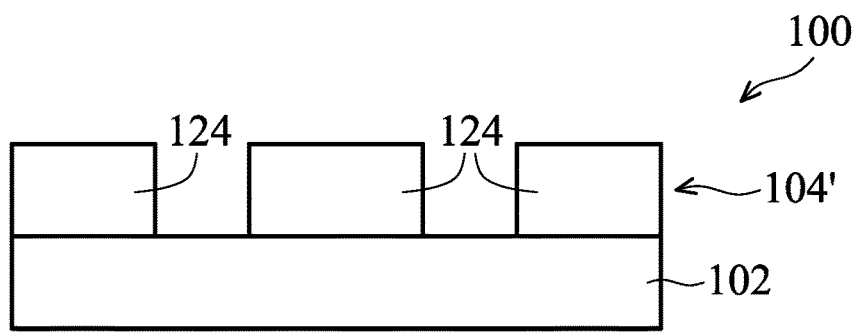

In some embodiments, the etching process 122 is a dry etching process, such as a plasma etching process. After the etching process 122 is performed, portions 124 of the patterned material layer 104' located under the unexposed portions 116 of the patterned photoresist layer 106' remain on the substrate 102, while the portions originally located under the exposed portions 114 are removed. Next, the unexposed portions 116 of the patterned photoresist layer 106' are removed to form the semiconductor structure 100, as shown in FIG. 1E in accordance with some embodiments.

It should be noted that, although the patterned photoresist layer 106' is used as a mask for etching the material layer 104, the scope of the disclosure is not intended to be limiting. That is, the patterned photoresist layer 106' may be used as a mask in various manufacturing processes, such as an implanting process.

As described previously, the photoresist layer 106 shown in FIGS. 1A to 1E may be made of the photoresist material having additional photo-sensing structures. More specifically, the photoresist material used to form the photoresist layer 106 may include photosensitive polymers having additional photosensitive functional groups and/or additional photosensitive compounds with photosensitive functional groups. During the exposure process 108, these additional photosensitive functional groups may help to improve the photon absorption efficiency and the contrast between the exposed portions 114 and the unexposed portions 116 may also be improved.

The photoresist material used to form the photoresist layer 106 described above may include various photosensitive compounds, such as a photosensitive polymer. In some embodiments, the photoresist material for forming the photoresist layer 106 includes at least one photosensitive polymer 20a to 20f shown in FIGS. 2A-2F.

Figure 2A:
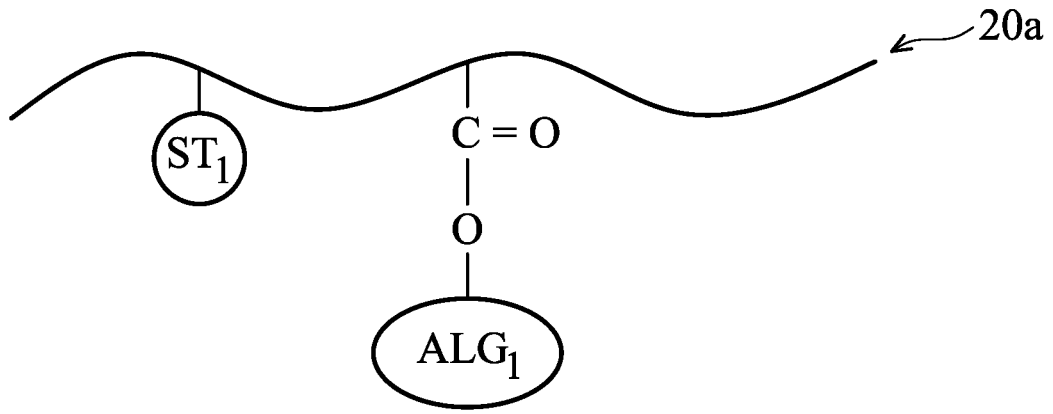
FIGS. 2A-2F are examples of photosensitive polymer 20a to 20f used in a photoresist material for forming a photoresist layer in accordance with some embodiments.

The photosensitive polymer 20a includes a photosensitive functional group $ST_1$ bonding to a main chain (e.g. a hydrocarbon chain) of the photosensitive polymer 20a, as shown in FIG. 2A in accordance with some embodiments. In some embodiments, the photosensitive functional group $ST_1$ is an aromatic group substituted with at least one hydroxyl group.

In addition, the photosensitive polymer 20a further includes an acid labile group $ALG_1$ bonding to the main chain of the photosensitive polymer 20a in accordance with some embodiments. The acid labile group $ALG_1$ may be seen as a protective group bonding to a carboxyl group on the main chain of the photosensitive polymer 20a, and the photosensitive polymer 20a tends to be de-protected to form the carboxyl group in an acidic environment. The solubility of the exposed portions (e.g. the exposed portions 114) which have de-protected carboxyl groups and the solubility of the unexposed portions (e.g. the unexposed portions 116) which have protected carboxyl groups will therefore be different.

In some embodiments, the acid labile group $ALG_1$ includes at least one tertiary carbon atom which tends to be released under an acidic condition. In some embodiments, the acid labile group $ALG_1$ is substituted or non-substituted $C_4$-$C_{20}$ alkyl groups, $C_4$-$C_{20}$ cycloalkyl groups, or the like. In some embodiments, the acid labile group $ALG_1$ has the following formula:

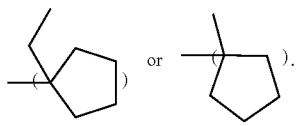

Figure 2B:
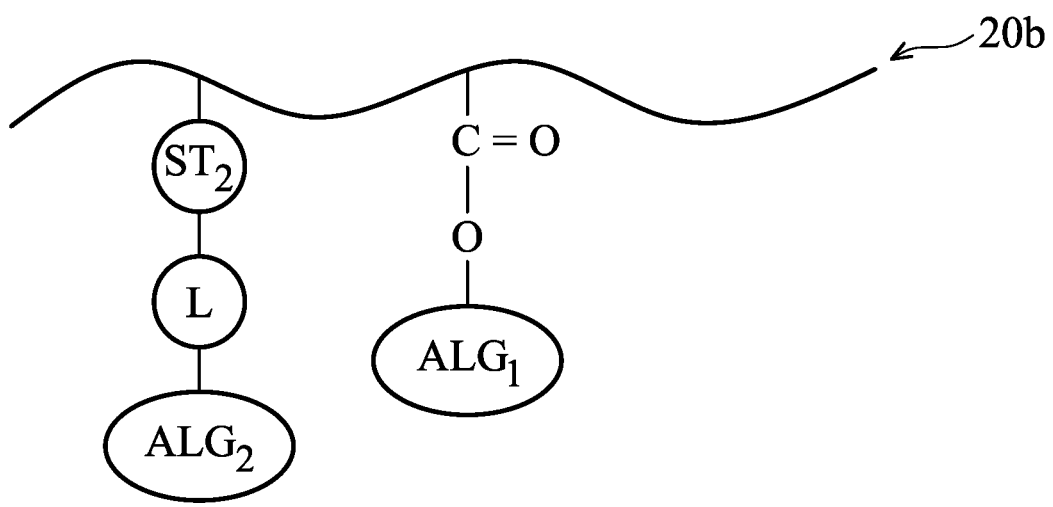

The photosensitive polymer 20b also includes the acid labile group $ALG_1$ described above and further includes a photosensitive functional group $ST_2$ and an additional acid labile group $ALG_2$ bonding through a linking structure L, as shown in FIG. 2B in accordance with some embodiments. In some embodiments, the linking structure L is a covalent bond, $C_1$-$C_{10}$ alkyl group, $C_3$-$C_{10}$ alkenyl group, $C_3$-$C_{10}$ alkynyl group, or $C_1$-$C_{10}$ alkoxy group.

More specifically, the photosensitive functional group $ST_2$ and the additional acid labile group $ALG_2$ are included in the same substituent on the main chain (e.g. a hydrocarbon chain) of the photosensitive polymer 20b. Therefore, the amount of the photosensitive functional group $ST_2$ can be increased to have a better photo-sensitivity without reducing the amount of acid labile groups in the photosensitive polymer 20b. Accordingly, the contrast between the exposed portions 114 and the unexposed portions 116 resulting from the release of the acid labile groups will not be undermined while the photo-sensitivity may be increase by having increased photosensitive functional group $ST_2$.

In some embodiments, the acid labile group $ALG_2$ includes at least one tertiary carbon atom which tends to be released under an acidic condition. In some embodiments, the acid labile group $ALG_2$ is substituted or non-substituted $C_4$-$C_{20}$ alkyl groups, $C_4$-$C_{20}$ cycloalkyl groups, or the like. In some embodiments, the acid labile group $ALG_2$ has the following formula:

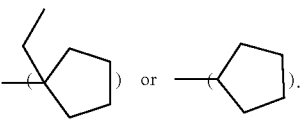

In some embodiments, the acid labile group $ALG_2$ and the acid labile group $ALG_1$ in the photosensitive polymer 20b are both substituted or non-substituted $C_4$-$C_{20}$ alkyl groups, or $C_4$-$C_{20}$ cycloalkyl groups, but the acid labile group $ALG_2$ is different from the acid labile group $ALG_1$.

In some embodiments, the photosensitive functional group $ST_2$ bonds to the main chain of the photosensitive polymer 20b through a covalent bond. In some embodiments, the photosensitive functional group $ST_2$ is a $C_6$-$C_{30}$ aromatic group substituted with at least one hydroxyl group or at least one thiol group. In some embodiments, the photosensitive functional group $ST_2$ includes one to five aromatic rings. These aromatic rings may help to observe the radiation and release electrons during the exposure process 108. However, there cannot be too many aromatic rings, or the steric hindrance of the photosensitive polymer 20b may be too great. In some embodiments, the photosensitive functional group $ST_2$ has one of the following formulae:

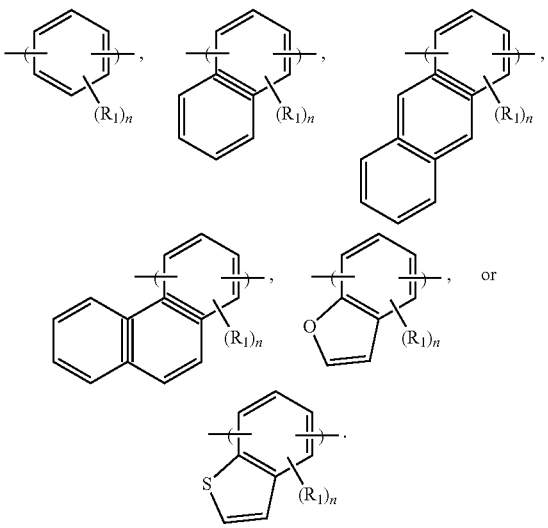

In some embodiments, $R_1$ is —OH or SH. In some embodiments, n is a positive integer less than 4. The $R_1$ of the photosensitive functional group $ST_2$ may help to observe the radiation and release electrons during the exposure process 108. However, the more $R_1$ the photosensitive functional group $ST_2$ has, the more hydrophilic the photosensitive polymer 20b will become. Therefore, there cannot be too many $R_1$ in the photosensitive functional group $ST_2$, or the photosensitive polymer 20b itself may become too hydrophilic even at the unexposed portions 116, and the contrast between the exposed portions 114 and the unexposed portions 116 may be undermined.

Figure 2C:
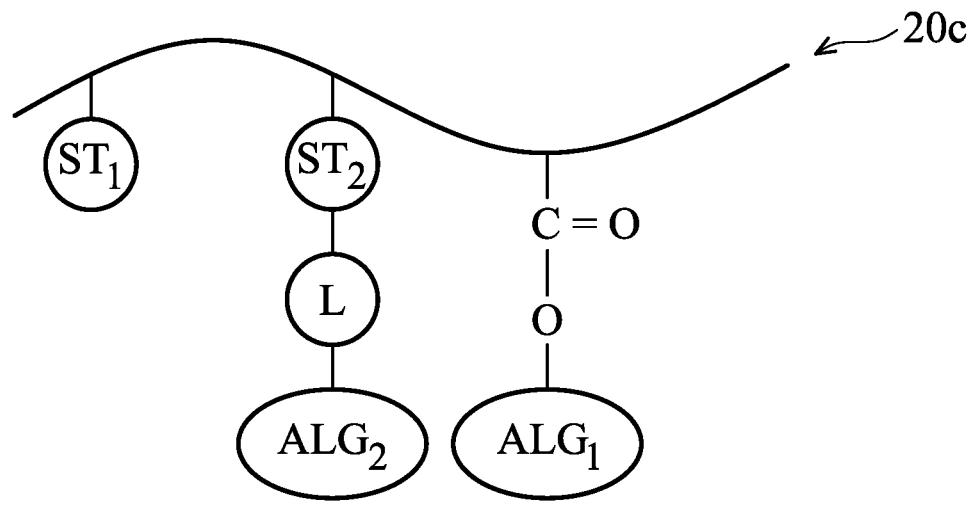

The photosensitive polymer 20c includes the acid labile group $ALG_1$ and the photosensitive functional group $ST_1$ and further includes the photosensitive functional group $ST_2$ bonding to the additional acid labile group $ALG_2$ through the linking structure L, as shown in FIG. 2C in accordance with some embodiments. More specifically, the acid labile group $ALG_1$ and the photosensitive functional group $ST_1$ may be similar to, or the same as, those in the photosensitive polymer 20a, and the photosensitive functional group $ST_2$ bonding to the additional acid labile group $ALG_2$ through the linking structure L may be similar to, or the same as, those in the photosensitive polymer 20b.

Other than the photosensitive functional group $ST_1$, the photosensitive polymer 20c further includes the photosensitive functional group $ST_2$ as additional photo-sensing structures to help to improve the photosensitivity of the photosensitive polymer 20c. Meanwhile, the additional acid labile group $ALG_2$ bonding to the photosensitive functional group $ST_2$ may help to improve the contrast during the lithography process shown in FIGS. 1A to 1E.

Figure 2D:
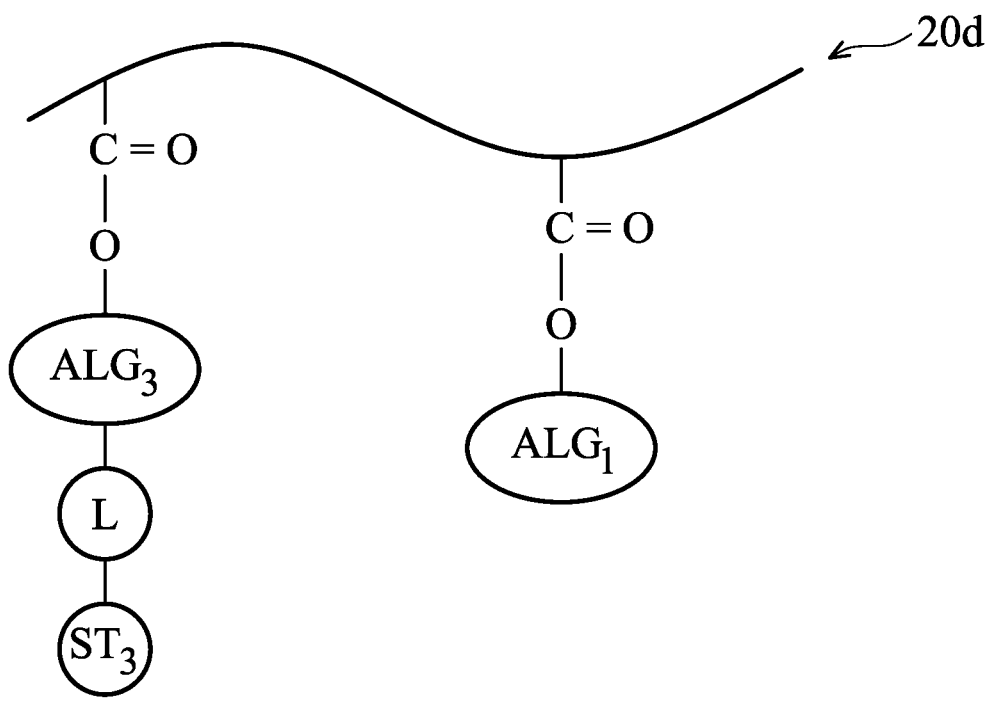
Figure 2E:
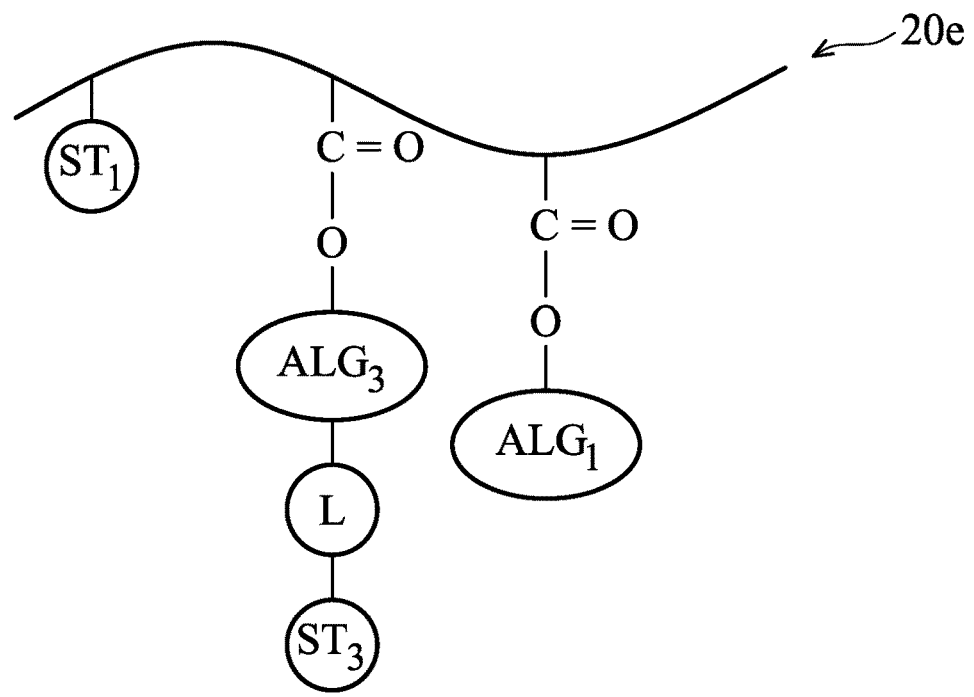

The photosensitive polymer 20d may be similar to the photosensitive polymer 20b, except its photosensitive group $ST_3$ is bonded to an end of the additional acid labile group $ALG_3$. More specifically, the photosensitive polymer 20d includes the acid labile group $ALG_1$ and the additional acid labile group $ALG_3$ bonding to a main chain (e.g. a hydrocarbon chain) of the photosensitive polymer 20d, and the photosensitive functional group $ST_3$ bonds to the additional acid labile group $ALG_3$ though the linking structure L, as shown in FIG. 2D in accordance with some embodiments. Similarly, since the photosensitive functional group $ST_3$ bonds to the additional acid labile group $ALG_3$, the amount of the photosensitive functional group $ST_3$ can be increased without undermining the contrast between the exposed portions 114 and unexposed portions 116. In addition, since the photosensitive functional group $ST_3$ bonds to one end of the acid labile group $ALG_3$, the photosensitive functional group $ST_3$ will be released along with the acid labile group $ALG_3$ in an acidic environment. Therefore, the photosensitive polymer 20d at the exposed portions 114 will become more hydrophilic, and the contrast between the exposed portions 114 and unexposed portions 116 may be further improved.

The acid labile group $ALG_3$ may be similar to, or the same as, the acid labile group $ALG_2$ described above and the structure of the acid labile group $ALG_3$ is not repeated herein. In some embodiments, the acid labile group $ALG_3$ and the acid labile group $ALG_1$ in the photosensitive polymer 20d are both substituted or non-substituted $C_4$-$C_{20}$ alkyl groups, or $C_4$-$C_{20}$ cycloalkyl groups, but the acid labile group $ALG_3$ is different from the acid labile group $ALG_1$.

In some embodiments, the photosensitive functional group $ST_3$ is a $C_6$-$C_{30}$ aromatic group substituted with at least one hydroxyl group or at least one thiol group. In some embodiments, the photosensitive functional group $ST_3$ includes one to five aromatic rings. These aromatic rings may help to observe the radiation and release electrons during the exposure process 108. However, since the photosensitive functional group $ST_3$ is bonded to the end of the acid labile group $ALG_3$, there cannot be too many aromatic rings, or else the steric hindrance for releasing the acid labile group $ALG_3$ may be too great and the release of the acid labile group $ALG_3$ on the photosensitive polymer 20d may become more difficult. In some embodiments, the photosensitive functional group $ST_3$ has one of the following formulae:

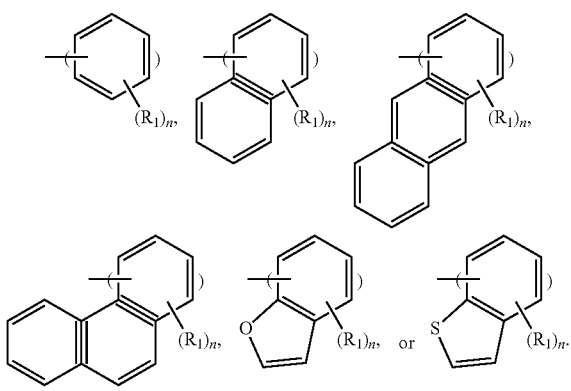

In some embodiments, $R_1$ is —OH or —SH. In some embodiments, n is a positive integer less than 4. As described previously, there cannot be too much $R_1$ in the photosensitive functional group $ST_3$, or else the photosensitive polymer 20d itself may become too hydrophilic.

Figure 2F:
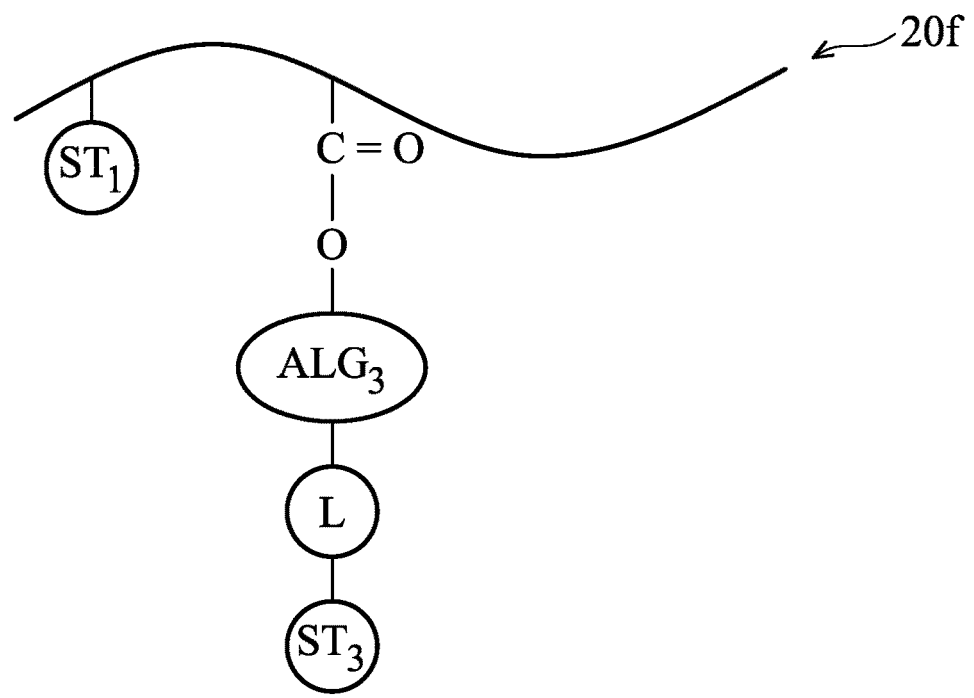

The photosensitive polymer 20e includes the acid labile group $ALG_1$, the photosensitive functional group $ST_1$, and the acid labile group $ALG_3$ bonding to a main chain (e.g. a hydrocarbon chain) of the photosensitive polymer 20e, and the photosensitive functional group $ST_3$ bonds to the acid labile group $ALG_3$ through the linking structure L as shown in FIG. 2F in accordance with some embodiments. Similarly, the amount of the acid labile group $ALG_1$, the photosensitive functional group $ST_1$, the photosensitive functional group $ST_3$, and the acid labile group $ALG_3$ may be adjusted to have improved photosensitivity and improved contrast during the lithography process shown in FIGS. 1A to 1E.

The photosensitive polymer 20f includes the photosensitive functional group $ST_1$ and the acid labile group $ALG_3$ bonding to a main chain (e.g. a hydrocarbon chain) of the photosensitive polymer 20f, and the photosensitive functional group $ST_3$ bonds to the acid labile group $ALG_3$ through the linking structure L as shown in FIG. 2F in accordance with some embodiments. Similarly, the energy efficiency and the contrast of the lithography process may be improved because of the acid labile group $ALG_3$ and the photosensitive functional group $ST_3$.

In some embodiments, the photoresist material for forming the photoresist layer 106 includes at least one photosensitive polymer described above (e.g. the photosensitive polymer 20a to 20f). In some embodiments, the photoresist material includes two different kinds of photosensitive polymers (e.g. the photosensitive polymer 20a to 20e). As described above, the photosensitive functional group $ST_2$ and the photosensitive functional group $ST_3$ may be seen as additional photo-sensing structures to improve energy conversion efficiency during the lithography process, and the acid labile group $ALG_2$ and the acid labile group $ALG_3$ may help to increase the contrast during the lithography process.

In some embodiments, the photoresist material used to form the photoresist layer 106 includes the photosensitive polymer having the photosensitive functional group $ST_2$ and acid labile group $ALG_2$ (e.g. photosensitive polymer 20b and 20c) and/or the photosensitive polymer having the photosensitive functional group $ST_3$ and the acid labile group $ALG_3$ (e.g. photosensitive polymer 20d, 20e and 20f). In some embodiments, the ratio of the amount of photosensitive functional group $ST_2$ and $ST_3$ to the amount of the photosensitive polymer is in a range from about 0.1 to about 0.7. In some embodiments, the weight average molecular weight of the photosensitive polymer is in a range from about 3000 to about 20000.

In some embodiments, the photoresist material for forming the photoresist layer 106 further includes photoacid generators (PAG). In some embodiments, the PAGs are sulfonium salt. In some embodiments, the PAGs include sulfonium cations and sulfonate. In some embodiments, the PAG has the following formula:

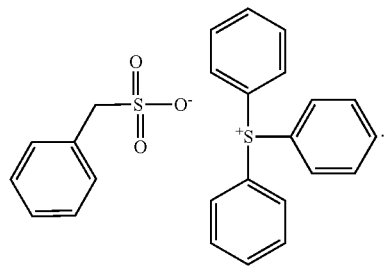 [SMILES: O=S(=O)([O-])Cc1ccccc1 ; c1ccc([S+](c2ccccc2)c2ccccc2)cc1]

In some embodiments, the photoresist material used to form the photoresist layer 106 further includes modified photoacid generators (PAGs). The modified PAGs may also observe radiation (e.g. photon) and release electrons. In some embodiments, the modified PAGs are sulfonium cations and/or sulfonate having substituents of the photosensitive functional group $ST_3$ described previously. In some embodiments, the modified PAGs have one of the following formulae:

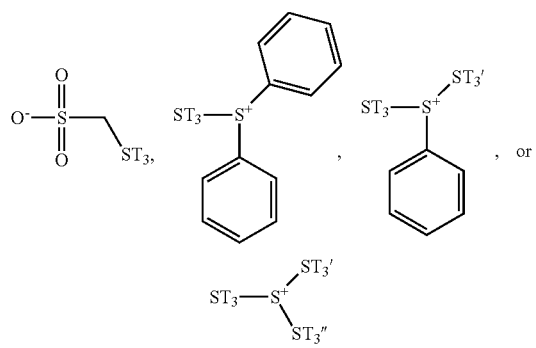

In some embodiments, $ST_3$ is a $C_6$-$C_{30}$ aromatic group substituted with at least one hydroxyl group or at least one thiol group; $ST_3'$ is a $C_6$-$C_{30}$ aromatic group substituted with at least one hydroxyl group or at least one thiol group; and $ST_3''$ is a $C_6$-$C_{30}$ aromatic group substituted with at least one hydroxyl group or at least one thiol group. In some embodiments, $ST_3$, $ST_3'$, and $ST_3''$ are different structures. Since the modified PAGs includes at least one photosensitive functional group (e.g. $ST_3$, $ST_3'$, or $ST_3''$), the photosensitivity of the photoresist material may be improved. In addition, since the modified PAG and PAG have similar sizes, the affinity between them may be better, and therefore the electron transfer between the modified PAG and PAG may be more efficient. Therefore, the energy conversion efficiency may be improved.

In some embodiments, the photoresist material used to form the photoresist layer 106 includes at least one photosensitive polymer (e.g. the photosensitive polymer 20a to 20f) and at least one PAG or modified PAG. In some embodiments, the photoresist material includes two different kinds of photosensitive polymers (e.g. the photosensitive polymer 20a to 20e) and one modified PAG.

In some embodiments, the photoresist material used to form the photoresist layer 106 further includes additional photosensitive compounds. These photosensitive compounds are configured to help to improve the photosensitivity during the lithography process. In addition, the size of the photosensitive compounds may be relatively small, compared to the photosensitive polymer described above, the electron transfer between the photosensitive compounds and the PAGs may be more efficient. In some embodiments, the molecular weight of the photosensitive compound is less than about 3000, and the molecular weight of the photosensitive polymer is in a range from about 3000 to about 20000.

In some embodiments, the photoresist material includes a first type of photosensitive compound $A_1$ having one of the following formulae:

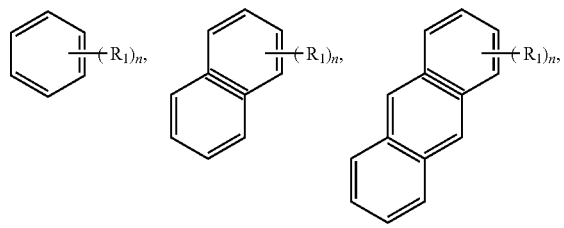

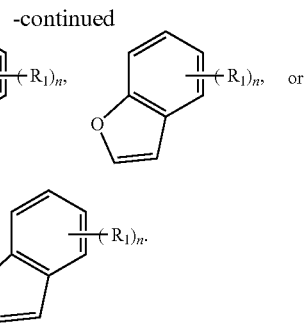

In some embodiments, $R_1$ is —OH or —SH, and n is a positive integer less than 4. In some embodiments, the photoresist material includes the photosensitive polymer and the first type of photosensitive compound $A_1$, and the ratio of the amount of the first type of photosensitive compound $A_1$ to the amount of the photosensitive polymer is in a range from about 0.1% to about 30%. The first type of photosensitive compound $A_1$ may help to improve the photosensitivity of the photoresist material. However, the photoresist material may not have too much first type of photosensitive compound $A_1$, or the resulting photoresist layer may become too hydrophilic. In some embodiments, the photoresist material includes more than one kinds of the first type of photosensitive compound $A_1$.

In some embodiments, the photoresist material includes a second type of photosensitive compound $A_2$ having the following formula (I):

(I)

In some embodiments, $R_2$, $R_3$, $R_4$ and $R_5$ are individually selected from H, $C_1$-$C_3$ alkyl group, and aryl group and at least one of $R_2$, $R_3$, $R_4$ and $R_5$ includes the photosensitive functional group $ST_3$. In some embodiments, $ST_3$ is a $C_6$-$C_{30}$ aromatic group substituted with at least one hydroxyl group or at least one thiol group. $R_2$, $R_3$, $R_4$ and $R_5$ may be the same or different. In some embodiments, the $R_2$, $R_3$, $R_4$ and $R_5$ totally include one to three photosensitive functional group $ST_3$.

In some embodiments, the second type of photosensitive compound $A_2$ has the following formula (II):

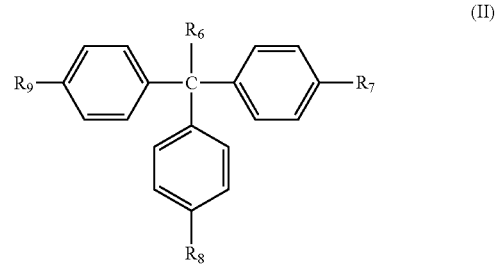

(II)

In some embodiments, $R_6$ is H or substituted or non-substituted $C_1$-$C_3$ alkyl group, and $R_7$, $R_8$, and $R_9$ individually are H, hydroxyl group, thiol group, or substituted or non-substituted $C_1$-$C_{10}$ linear, branch, or cyclic alkyl group. In some embodiments, at least one of $R_7$, $R_8$, and $R_9$ is $C_1$-$C_{10}$ linear, branch, or cyclic alkyl group substituted with the photosensitive functional group $ST_3$ described previously.

In some embodiments, the second type of photosensitive compound $A_2$ has the following formula (III):

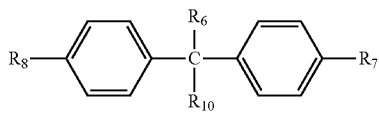
(III)

In some embodiments, $R_6$ and $R_{10}$ individually are H or substituted or non-substituted $C_1$-$C_3$ alkyl group, and $R_7$ and $R_5$ individually are H, hydroxyl group, thiol group, or substituted or non-substituted $C_1$-$C_{10}$ linear, branch, or cyclic alkyl group. In some embodiments, at least one of $R_7$ and $R_5$ is $C_1$-$C_{10}$ linear, branch, or cyclic alkyl group substituted with the photosensitive functional group $ST_3$ described previously.

In some embodiments, the second type of photosensitive compound $A_2$ has one of the following formulae (IV) to (X):

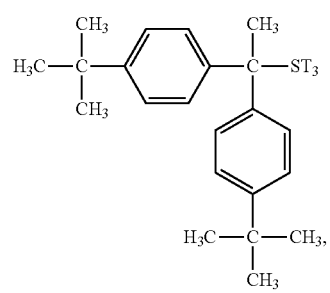
(IV)

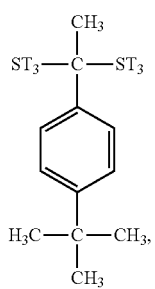
(V)

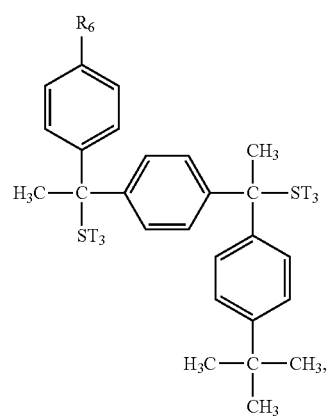
(VI)

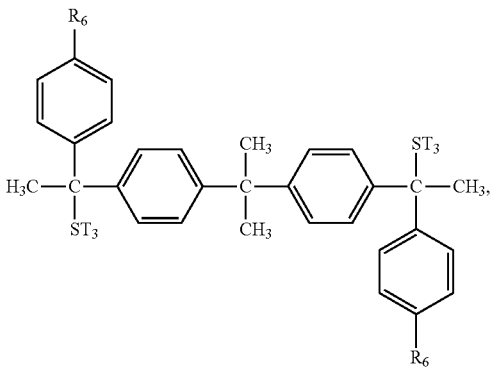
(VII)

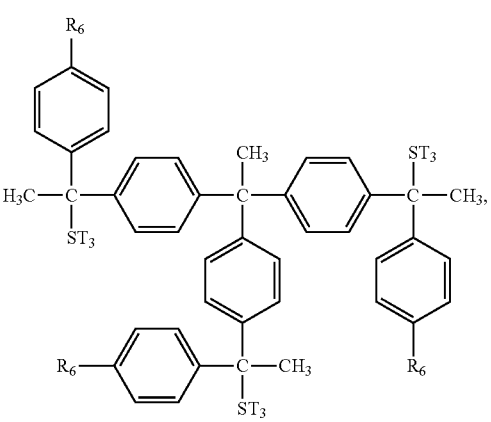
(VIII)

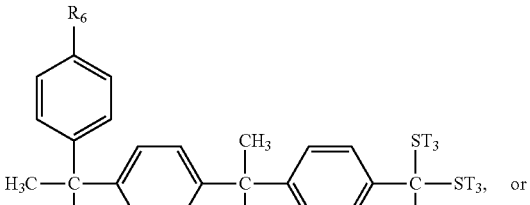
(IX)

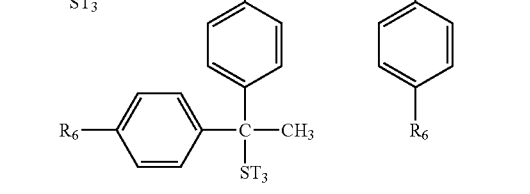
(X)

As shown above, the second type of photosensitive compound $A_2$ may have aryl groups with hydroxyl group or thiol group substituents, and these aryl groups may be seen as photosensitive structure which may help to improve the photosensitivity of the photoresist material. However, the second type of photosensitive compound $A_2$ has too many aryl groups with hydroxyl group or thiol group substituent, it may become too hydrophilic. Therefore, the second type of photosensitive compound $A_2$ may further have aryl groups with alkyl group substituent, and these aryl groups may be used as dissolution inhibitor or affinity controller to adjust the solubility of the photosensitive compound $A_2$.

In some embodiments, the molecular weight of the second type of photosensitive compound $A_2$ is less than about 3000. In some embodiments, the molecular weight of the second type of photosensitive compound $A_2$ is less than about 2000. Since the molecular weight of the second type of photosensitive compound $A_2$ is relatively small, compared to the photosensitive polymer in the photoresist material, the electrons release from the second type of photosensitive compound $A_2$ will be easier to reach the PAG in the photoresist material. Therefore, the electrical efficiency may be improved.

In some embodiments, the photoresist material used to form the photoresist layer 106 includes at least one photosensitive polymer (e.g. the photosensitive polymer 20a to 20f), at least one PAG or modified PAG and at least one first type of photosensitive compound $A_1$ or second type of photosensitive compound $A_2$.

In some embodiments, the photoresist material used to form the photoresist layer 106 further includes a quencher. The quencher may be amine derivatives including primary, secondary, tertiary aliphatic or aromatic amine.

In some embodiments, the photoresist material used to form the photoresist layer 106 further includes a crosslinker. The crosslinker may be amine, aminol, epoxyl, alcohol, acid, ester, anhydride, lactone, or the like.

In some embodiments, the photoresist material used to form the photoresist layer 106 includes at least one photosensitive polymer (e.g. the photosensitive polymer 20a to 20f) and at least one PAG or modified PAG. In some embodiments, the photoresist material includes two different kinds of photosensitive polymers (e.g. the photosensitive polymer 20a to 20e). In some embodiments, the photoresist material includes two different kinds of photosensitive polymers (e.g. the photosensitive polymer 20a to 20e) and one modified PAG.

The photoresist material described above may also be used in a lithography process using a negative tone developer. FIGS. 3A to 3E show cross-sectional representations of various stages of forming a semiconductor structure 200 including performing an EUV lithography process in accordance with some embodiments. The processes shown in FIGS. 3A to 3B may be similar to the processes shown in FIGS. 1A to 1E, except a negative tone developer is used in the process.

Figure 3A:
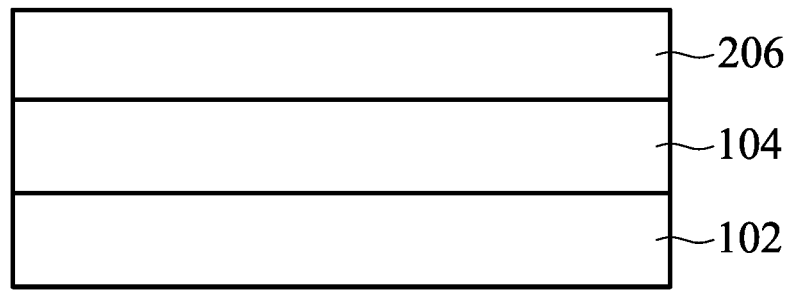
FIGS. 3A to 3E show cross-sectional representations of various stages of forming a semiconductor structure including performing an EUV lithography process in accordance with some embodiments.

More specifically, a photoresist layer 206 is formed over the material layer 104 over the substrate 102, as shown in FIG. 3A in accordance with some embodiments. The photoresist material used to form the photoresist layer 206 may be the same as that used to form the photoresist layer 106 described above and therefore detail of the photoresist material is not repeated herein.

Figure 3B:
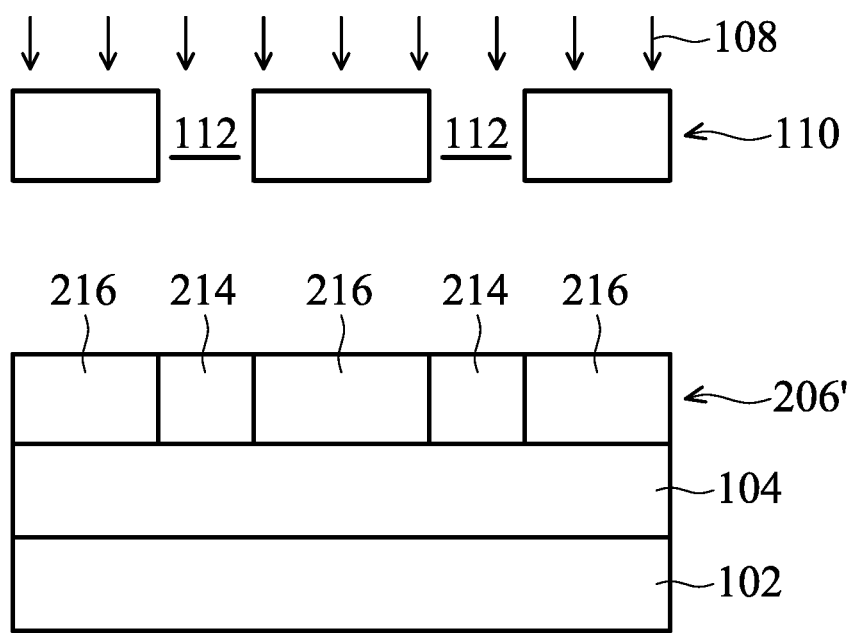

After the photoresist layer 206 is formed, the exposure process 108 is performed on the photoresist layer 206 to form a patterned photoresist layer 206', and then the patterned photoresist layer 206' is heated, as shown in FIG. 3B in accordance with some embodiments. More specifically, the mask structure 110 with the openings 112 is positioned over the photoresist layer 206 during the exposure process 108 to form exposed portions 214 and unexposed portions 216. As described previously, the photosensitive polymer in the exposed portions 214 of the patterned photoresist layer 206' may become more hydrophilic after the exposure process 108 is performed.

Figure 3C:
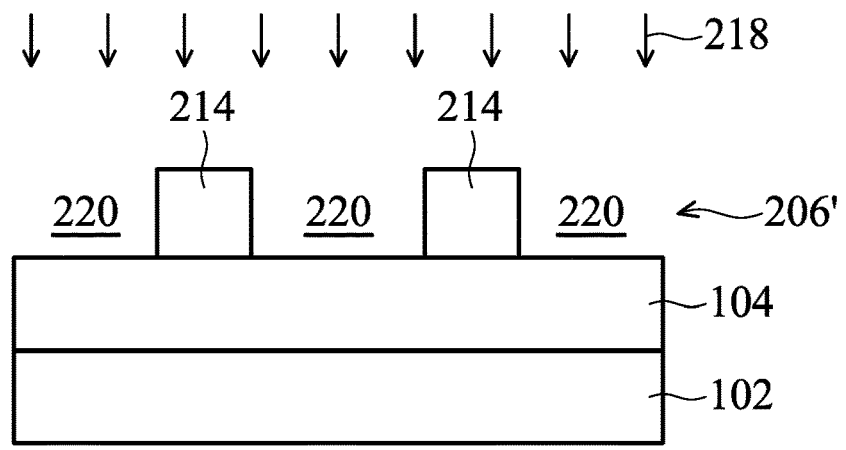

Next, a developing process 218 is performed on the patterned photoresist layer 206' to form openings 220, as shown in FIG. 3C in accordance with some embodiments. The unexposed portions 216 of the patterned photoresist layer 206' are dissolved in a developer used in the developing process 218 and are removed with the developer, while the exposed portions 214 remain on the material layer 104 after the developing process 218 is performed, as shown in FIG. 3C in accordance with some embodiments.

In addition, as described previously, the acid labile groups (e.g. the acid labile groups $ALG_1$, $ALG_2$, and $ALG_3$) of the photosensitive polymer (e.g. the photosensitive polymers 20a to 20f) in the exposed portions 214 of the patterned photoresist layer 206' may be released to form —COOH group, so the exposed portions 214 become more hydrophilic and will not be dissolved in the developer during the developing process 218. However, some holes may be formed in the exposed portions 214 due to the release of these acid labile groups. Therefore, the photoresist material for forming the patterned photoresist layer 206' may further includes photosensitive compounds (e.g. the second type of photosensitive compounds $A_2$) and crosslinkers, and the photosensitive compounds may react with the crosslinkers to fill in the holes in the exposed portions 214 to prevent the exposed portions 214 from bending or collapse.

In some embodiments, the developer is a negative tone developer used in a EUV process. In some embodiments, the developer is an organic solvent. In some embodiments, the developer is made of an organic compound having less than 15 carbons. In some embodiments, the developer includes compounds having ester groups and/or ketone groups. In some embodiments, the developer includes 2-heptanone, n-butyl acetate, isoamyl acetate, cyclohexanone, 2-heptanone, 5-methyl-2-hexanone, methyl-2-hydroxyisobutyrate, ethyl lactate or propylene glycol monomethyl ether acetate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, isobutyl propionate, or combinations thereof.

Figure 3D:
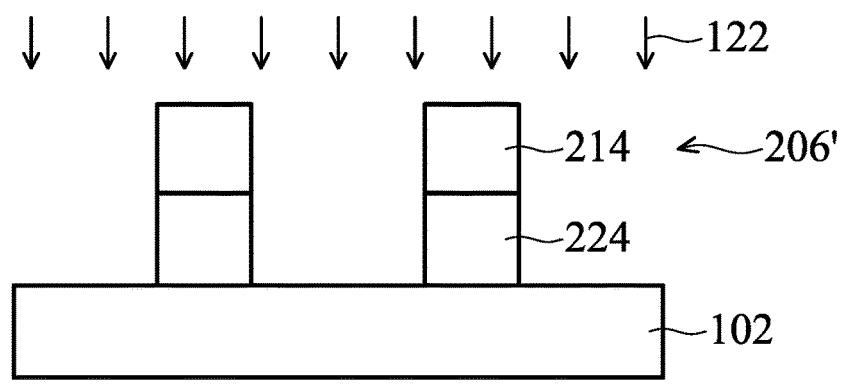
Figure 3E:
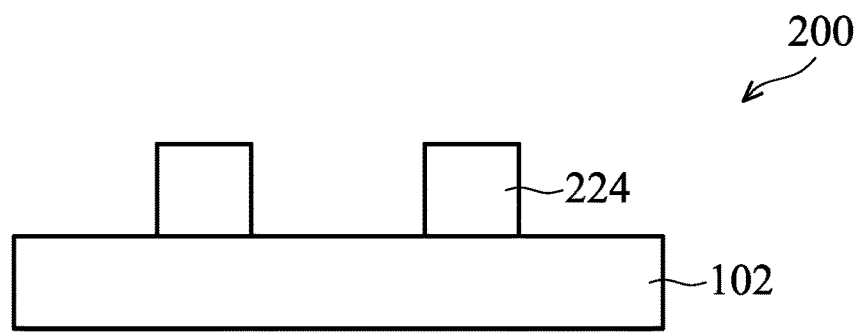

After the developing process 218 is performed, the etching process 122 is performed to etch the material layer 104 through the openings 220, as shown in FIG. 3D in accordance with some embodiments. As shown in FIG. 3D, portions 224 located under the exposed portions 214 of the patterned photoresist layer 206' are left on the substrate 102, while the portions originally located under the unexposed portions 216 are removed. Next, the exposed portions 214 of the patterned photoresist layer 206' are removed to form the semiconductor structure 200, as shown in FIG. 3E in accordance with some embodiments.

As described above, a photoresist material for forming a photoresist layer used in an EUV lithography process may include photosensitive compounds, such as photosensitive polymer having photosensitive functional groups and acid labile groups. The photosensitive functional groups can absorb radiation and release electrons during the lithography process. Therefore, when the amount of the photosensitive functional groups increases, the photosensitivity of the lithography process may be improved. However, if the photosensitive functional groups and the acid labile groups are both bonded to the main chain of the photosensitive polymer as separated substituents, there cannot be too many the photosensitive functional groups, or the amount of the acid labile groups may have to be reduced, and the contrast may therefore be undermined. Accordingly, in some embodiments described above, the additional photosensitive functional groups (e.g. $ST_2$ and $ST_3$) and acid labile groups ($ALG_2$ and $ALG_3$) are bonded to main chain of the photosensitive polymers (e.g. 20*b* to 20*f*) as a single substituent. Therefore, the photoresist polymers can have additional photosensitive functional group without reducing the amount of the acid labile groups, so that the contract between the exposed portions and unexposed portions will not be undermined.

In some embodiments, photosensitive compounds having additional photosensitive functional groups (e.g. modified PAGs, the first type of photosensitive compound $A_1$, or the second photosensitive compound $A_2$) are added in the photoresist material to improve the photosensitivity. In addition, since these compounds may have more similar sizes with the PAGs, compared to the photosensitive polymer, it may be easier to transfer the electrons released by these photosensitive compounds to the PAG. Therefore, the energy conversion efficiency may be further improved.

Embodiments for forming a semiconductor structure including using a lithography process are provided. The lithography process may include forming a photoresist layer over a material layer and patterning the photoresist layer by performing an exposure process and a developing process. The photoresist layer may be made of a photoresist material including a photosensitive polymer having photosensitive groups and acid labile groups. In addition, the photoresist material may further include addition photosensitive functional group to have improved photosensitivity, while the amount of the acid labile groups will not have to be reduced. Therefore, the contrast of the patterned photoresist layer will not be undermined due to reducing the amount of the acid labile groups.

In some embodiments, a method for forming a semiconductor structure is provided. The method for forming a semiconductor structure includes forming a material layer over a substrate and forming a photoresist layer over the material layer. The method for forming a semiconductor structure further includes performing an exposure process on the photoresist layer and developing the photoresist layer. In addition, the photoresist layer is made of a photoresist material comprising a photosensitive polymer, and the photosensitive polymer has a first photosensitive functional group bonding to a main chain of the photosensitive polymer and a first acid labile group bonding to the first photosensitive functional group.

In some embodiments, a method for forming a semiconductor structure is provided. The method for forming a semiconductor structure includes forming a material layer over a substrate and forming a photoresist layer over the material layer. The method for forming a semiconductor structure further includes performing an exposure process on the photoresist layer and developing the photoresist layer. In addition, the photoresist layer is made of a photoresist material including a first photosensitive compound and a second photosensitive compound, and the first photosensitive compound is a photosensitive polymer having a first acid labile group and a first photosensitive functional group bonding to a main chain of the photosensitive polymer, and the second photosensitive compound has a second photosensitive functional group, and the second photosensitive compound has a molecular weight less than about 3000.

In some embodiments, a method for forming a semiconductor structure is provided. The method for forming a semiconductor structure includes forming a material layer over a substrate and forming a photoresist layer over the material layer. The method for forming a semiconductor structure further includes performing an exposure process on the photoresist layer and developing the photoresist layer to form a patterned photoresist layer. The method for forming a semiconductor structure further includes patterning the material layer through the patterned photoresist layer. In addition, the photoresist layer is made of a photoresist material including a photosensitive polymer, and the photosensitive polymer has a first acid labile group, a second acid labile group different from the first acid labile group, and a first photosensitive functional group, and the first photosensitive functional group bonds to the first acid labile group.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:

forming a material layer over a substrate;

forming a photoresist layer over the material layer;

performing an exposure process on the photoresist layer; and developing the photoresist layer, wherein the photoresist layer is made of a photoresist material comprising a photosensitive polymer, and the photosensitive polymer has a first photosensitive functional group bonding to a main chain of the photosensitive polymer and a first acid labile group bonding to the first photosensitive functional group, and wherein the first acid labile group is bonded to an end of the first photosensitive functional group.

2. The method for forming a semiconductor structure as claimed in claim 1, wherein the first photosensitive functional group is a $C_6$-$C_{30}$ aromatic group substituted with at least one hydroxyl group or at least one thiol group.

3. The method for forming a semiconductor structure as claimed in claim 1, wherein the first photosensitive functional group and the first acid labile group are released from the main chain of the photosensitive polymer to form an COOH group on the photosensitive polymer after the exposure process is performed.

4. The method for forming a semiconductor structure as claimed in claim 3, wherein the photosensitive polymer further has a second photosensitive functional group bonding to the main chain of the photosensitive polymer through a covalent bond, and the second photosensitive functional group remains on the main chain of the photosensitive polymer after the exposure process is performed.

5. The method for forming a semiconductor structure as claimed in claim 1, wherein the photosensitive polymer further has a second acid labile group that bonds to the main chain of the photosensitive polymer, and the first acid labile group is different from the second acid labile group.

6. The method for forming a semiconductor structure as claimed in claim 1, wherein the first acid labile group bonds to the first photosensitive group through a linker, and the linker is a covalent bond, $C_1$-$C_{10}$ alkyl group, $C_1$-$C_{10}$ alkenyl group, or $C_1$-$C_{10}$ alkynyl group.

7. The method for forming a semiconductor structure as claimed in claim 6, wherein the linker is separated from the main chain of the photosensitive polymer by the first photosensitive functional group.

8. The method for forming a semiconductor structure as claimed in claim 1, wherein the photoresist material further comprises a compound having one of the following formulae:

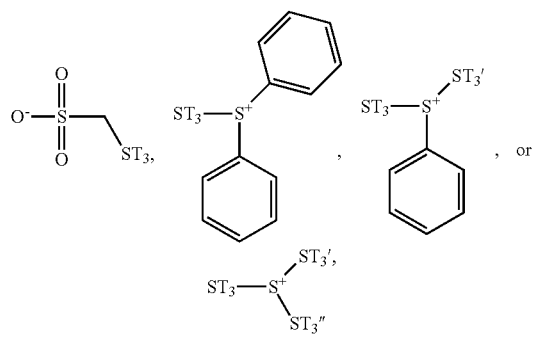

wherein $ST_3$ is a $C_6$-$C_{30}$ aromatic group substituted with at least one hydroxyl group or at least one thiol group;
$ST_3'$ is a $C_6$-$C_{30}$ aromatic group substituted with at least one hydroxyl group or at least one thiol group; and
$ST_3''$ is a $C_6$-$C_{30}$ aromatic group substituted with at least one hydroxyl group or at least one thiol group.

9. The method for forming a semiconductor structure as claimed in claim 1, wherein the photoresist material further comprises an additional photosensitive compound having an aromatic group substituted with at least one hydroxyl group or at least one thiol group, and the additional photosensitive compound has a molecular weight less than about 2000.

10. The method for forming a semiconductor structure as claimed in claim 1, wherein the first photosensitive functional group and the first acid labile group are included in a single substituent on the main chain of the photosensitive polymer.

11. A method for forming a semiconductor structure, comprising:
forming a material layer over a substrate;
forming a photoresist layer over the material layer;
performing an exposure process on the photoresist layer; and
developing the photoresist layer,
wherein the photoresist layer is made of a photoresist material comprising a first photosensitive compound and a second photosensitive compound, and the first photosensitive compound is a photosensitive polymer having a first acid labile group and a first photosensitive functional group bonding to a main chain of the photosensitive polymer, and the second photosensitive compound has a second photosensitive functional group, and the second photosensitive compound has a molecular weight less than about 3000, and
wherein the first photosensitive functional group is bonded to an end of the first acid labile group.

12. The method for forming a semiconductor structure as claimed in claim 11, wherein the second photosensitive compound has the following formula:

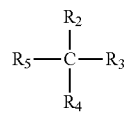

wherein $R_2$, $R_3$, $R_4$ and $R_5$ are individually selected from H, $C_1$-$C_3$ alkyl group, and aryl group and at least one of $R_2$, $R_3$, $R_4$ and $R_5$ comprises the second photosensitive functional group, and the second photosensitive functional group is a $C_6$-$C_{30}$ aromatic group substituted with at least one hydroxyl group or at least one thiol group.

13. The method for forming a semiconductor structure as claimed in claim 12, wherein the second photosensitive compound has one of the following formulae:

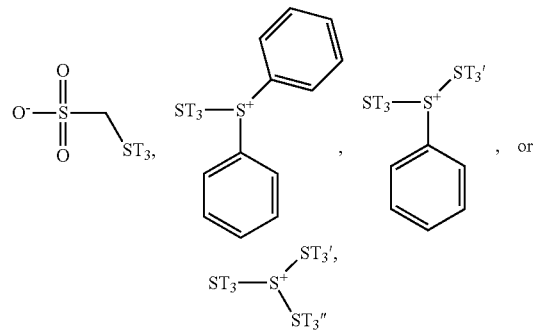

wherein $ST_3$ is a $C_6$-$C_{30}$ aromatic group substituted with at least one hydroxyl group or at least one thiol group;
$ST_3'$ is a $C_6$-$C_{30}$ aromatic group substituted with at least one hydroxyl group or at least one thiol group; and
$ST_3''$ is a $C_6$-$C_{30}$ aromatic group substituted with at least one hydroxyl group or at least one thiol group.

14. The method for forming a semiconductor structure as claimed in claim 11, wherein the second photosensitive compound has one of the following formulae:

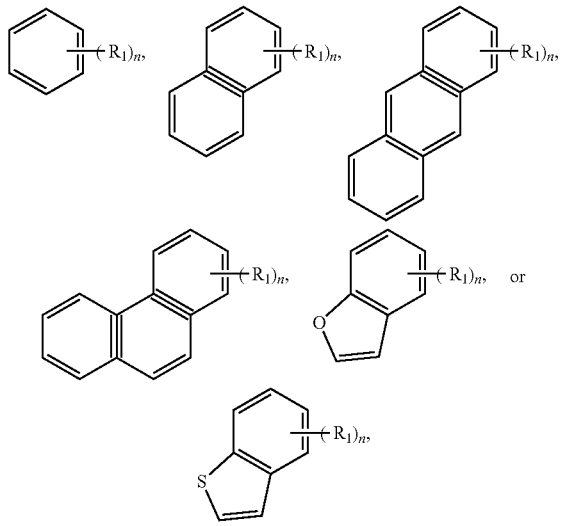

wherein $R_1$ is —OH or —SH, and n is a positive integer less than 4.

15. The method for forming a semiconductor structure as claimed in claim 11, wherein the first photosensitive functional group is a $C_6$-$C_{30}$ aromatic group substituted with at least one hydroxyl group or at least one thiol group.

16. The method for forming a semiconductor structure as claimed in claim 11, wherein the photosensitive polymer further comprises a second acid labile group bonding to the main chain of the photosensitive polymer, and the first acid labile group is different from the second acid labile group.

17. The method for forming a semiconductor structure as claimed in claim 11, wherein the second photosensitive compound has a molecular weight less than about 2000, and the photosensitive polymer has a weight average molecular weight in a range from about 3000 to about 20000.

18. A method for forming a semiconductor structure, comprising:
    forming a material layer over a substrate;
    forming a photoresist layer over the material layer;
    performing an exposure process on the photoresist layer;
    developing the photoresist layer to form a patterned photoresist layer; and
    patterning the material layer through the patterned photoresist layer,
    wherein the photoresist layer is made of a photoresist material comprising a photosensitive polymer, and the photosensitive polymer has a first acid labile group, a second acid labile group different from the first acid labile group, and a first photosensitive functional group, and the first photosensitive functional group bonds to the first acid labile group, and
    wherein the first acid labile group is further away from a main chain of the photosensitive polymer than the first photosensitive functional group.

19. The method for forming a semiconductor structure as claimed in claim 18, wherein the photosensitive polymer is hydrolyzed to release the first acid labile group and the second acid labile group alone with the first photosensitive functional group after the exposure process is performed.

20. The method for forming a semiconductor structure as claimed in claim 18, wherein the photoresist material further comprises a cross-linker, and the cross-linker bonds to the first photosensitive compounds after the exposure process is performed.

* * * * *